US009698790B2

(12) United States Patent
Roberts

(10) Patent No.: US 9,698,790 B2
(45) Date of Patent: Jul. 4, 2017

(54) COMPUTER ARCHITECTURE USING RAPIDLY RECONFIGURABLE CIRCUITS AND HIGH-BANDWIDTH MEMORY INTERFACES

(71) Applicant: Advanced Micro Devices, Inc., Sunnyvale, CA (US)

(72) Inventor: David A. Roberts, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/751,947

(22) Filed: Jun. 26, 2015

(65) Prior Publication Data

US 2016/0380635 A1 Dec. 29, 2016

(51) Int. Cl.
*H03K 19/17* (2006.01)
*H03K 19/00* (2006.01)
*G06F 15/78* (2006.01)
*H03K 19/177* (2006.01)

(52) U.S. Cl.
CPC ... *H03K 19/17728* (2013.01); *G06F 15/7892* (2013.01); *H03K 19/0008* (2013.01); *H03K 19/1776* (2013.01); *H03K 19/17776* (2013.01)

(58) Field of Classification Search
CPC .......... G06F 2015/768; G06F 17/5054; G06F 21/76; H03K 19/17704; H03K 19/17708; H03K 19/17724; H03K 19/17728; G05B 2219/13007; G05B 2219/25268
See application file for complete search history.

(56) References Cited

U.S. PATENT DOCUMENTS

| 5,737,631 A | 4/1998 | Trimberger |
| 6,091,263 A | 7/2000 | New et al. |
| 6,237,054 B1 * | 5/2001 | Freitag, Jr. ...... G01R 31/318558 710/72 |
| 7,180,324 B2 * | 2/2007 | Chan ............... H03K 19/17764 326/10 |
| 7,243,221 B1 * | 7/2007 | Ryser ...................... G06F 9/48 713/1 |
| 7,410,884 B2 * | 8/2008 | Ramanathan ..... H01L 21/76898 257/686 |
| 7,902,865 B1 * | 3/2011 | Cheng ................. G06F 17/5054 326/41 |

(Continued)

OTHER PUBLICATIONS

Brown, Stephen, and Jonathan Rose. "Architecture of FPGAs and CPLDs: A tutorial." IEEE Design and Test of Computers 13.2 (1996): 42-57.

(Continued)

*Primary Examiner* — Vibol Tan
(74) *Attorney, Agent, or Firm* — Liang & Cheng, PC

(57) ABSTRACT

A programmable device comprises one or more programming regions, each comprising a plurality of configurable logic blocks, where each of the plurality of configurable logic blocks is selectively connectable to any other configurable logic block via a programmable interconnect fabric. The programmable device further comprises configuration logic configured to, in response to an instruction in an instruction stream, reconfigure hardware in one or more of the configurable logic blocks in a programming region independently from any of the other programming regions.

27 Claims, 6 Drawing Sheets

(56) References Cited

U.S. PATENT DOCUMENTS 8,928,351 B1 1/2015 Konduru
2015/0155876 A1 6/2015 Jayasena et al.

OTHER PUBLICATIONS

Rose, Jonathan, Abbas El Gamal, and Alberto Sangiovanni-Vincentelli. "Architecture of field-programmable gate arrays." Proceedings of the IEEE 81.7 (1993): 1013-1029.
Tapp, Stephanie. "Bpi fast configuration and impact flash programming with 7 series fpgas." (Feb. 9, 2015). Xilinx, Inc.
Campi F et al: "A VLIW processor with reconfigurable instruction set for embedded applications", IEEE Journal of Solid-State Circuits, IEEE Service Center, Piscataway, NJ, USA, vol. 38, No. 11, Nov. 1, 2003 (Nov. 1, 2003), pp. 1876-1886, XP011102775, ISSN: 0018-9200, 001: 10. 1109/JSSC.2003.818292 figures 2-5 figure 8 p. 1878, right-hand column, line 7 - line 20 p. 1880, left-hand column, line 25 - line 37.
International Search Report, Application No. PCT/US2016/032504 dated Sep. 1, 2016.

* cited by examiner

COMPUTER ARCHITECTURE USING RAPIDLY RECONFIGURABLE CIRCUITS AND HIGH-BANDWIDTH MEMORY INTERFACES

TECHNICAL FIELD

This disclosure relates to the field of programmable devices and, in particular, to reconfiguration of logic circuits in response to instructions in an instruction stream.

BACKGROUND

A field-programmable gate array (FPGA) is an integrated circuit device that is designed to be configured by an end user after manufacturing. In general, an FPGA comprises an array of uncommitted circuit elements, called logic blocks, that are connected together by interconnect resources making up a programmable interconnect fabric. The interconnect resources may include, for example, logic gates that can be inter-wired in different configurations. The logic blocks in the FPGA can be configured to perform complex combinational functions, or logic functions such as AND or XOR. Logic blocks in an FPGA can also include memory elements, which may be implemented as simple flip-flops or more complete blocks of memory.

In an FPGA, the logic blocks can include elements such as lookup tables (LUTs) and other fixed functions that are programmed by inserting values into small Static Random Access Memories (SRAMs) or registers. The programming must be performed before the logic blocks can be used. After programming, each combination of function inputs to an LUT results in a predefined output, allowing implementation of any logic function. A typical FPGA relies on an external memory device and a single, relatively slow serial programming port for configuration. The FPGA typically has a "configuration mode" and a separate "user mode" where the entire chip is either in an idle state waiting to be programmed, or the programmed chip is running.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the spirit and scope of the embodiments.

One embodiment of a programmable device is a Field-Programmable Gate Array (FPGA) having multiple configuration domains that can be reconfigured in parallel and independently of each other based on instructions in an instruction stream. Configuration data for each of the multiple configuration domains can be stored in three-dimensional (3D) stacked memory, which provides high-bandwidth access to the configuration data. The partitioning of the programmable logic in the device in conjunction with the high memory bandwidth allows for reconfiguration of the programmable logic within a few clock cycles, allowing for flexible pipelines that can be reconfigured to accommodate different types of instructions.

The implementation of flexible pipelines allows for greater flexibility in instruction scheduling, in contrast with fixed function processing pipelines, since any pipeline can be reconfigured to execute any of multiple types of instructions without interrupting execution of the instruction stream. In such a system, different threads executing different functions can be scheduled in a single cycle across multiple execution lanes.

Figure 1:
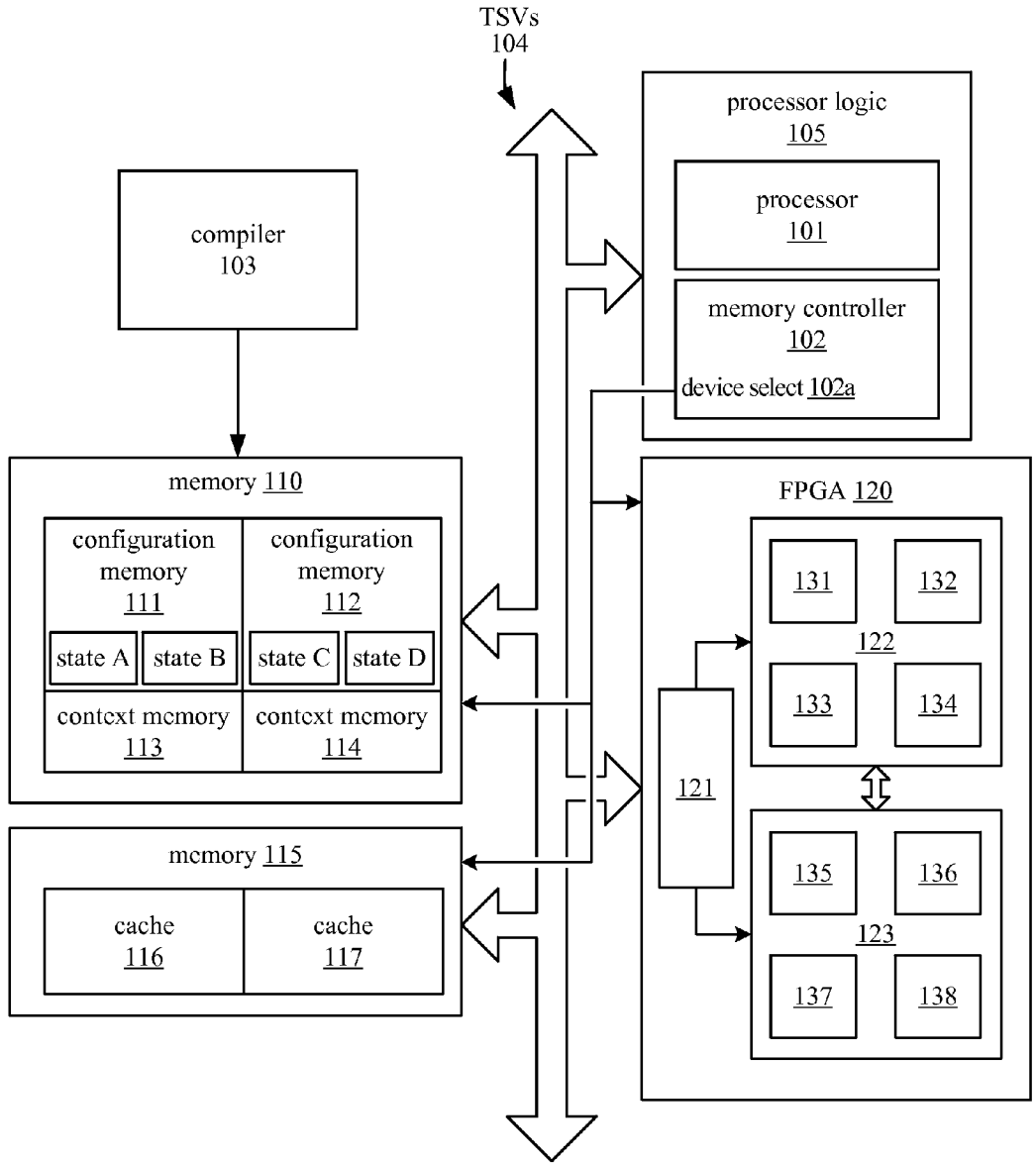
FIG. 1 illustrates an embodiment of a computing system.

FIG. 1 illustrates an embodiment of a computing system 100 that includes a programmable device (i.e., FPGA 120) having multiple configuration domains. The computing system 100 includes components that are capable of communicating with each other using a bus, which is implemented in computing system 100 by a set of through-silicon vias (TSVs) 104. The TSVs 104 connect and enable communication between the processor logic 105 block (including processor 101 and memory controller 102), memory block 110, memory block 115, and FPGA 120. In one embodiment, each of the blocks 105, 110, 115, and 120 corresponds to a single integrated circuit die. In alternative embodiments, components illustrated as being in different blocks can be integrated on the same die, or components illustrated as being in the same block can be divided across multiple dies.

The processor 101 is capable of transmitting data over the TSVs 104 that is addressed to one or more of the other devices connected to the TSVs 104, and can also receive data from the other devices connected to the TSVs 104. The processor 101 is also capable of executing programs that are defined by instructions stored in the memory subsystem 110, and may further dispatch some or all of these instructions in an instruction stream to be executed by the FPGA 120.

The FPGA 120 includes programming regions 122 and 123. Programming region 122 includes configurable logic blocks 131-134, and programming region 123 includes configurable logic blocks 135-138. Programmable logic in the FPGA 120 resides in the configurable logic blocks 131-138 and is thus partitioned into multiple configuration domains that are separately configurable and that are defined by the boundaries of the programming regions 122 and 123. While FIG. 1 illustrates FPGA 120 as including two programming regions 122 and 123, in alternative embodiments, FPGA 120 can have more than two programming regions. In alternative embodiments, each of the programming regions may also include fewer or more than four configurable logic blocks. The FPGA 120 also includes configuration logic 121, which receives configuration data and reconfigures one or more of the programming regions in the FPGA 120 according to the received configuration data.

The memory 110 includes configuration memory regions 111 and 112, which store configuration data for the programming regions in FPGA 120. Configuration memory regions 111 and 112 correspond respectively to programming regions 122 and 123; thus, the configuration memory 111 stores configuration data that can be used to configure programming region 122, while configuration memory 112 stores configuration data that can be used to configure programming region 123. Each of the configuration memory regions 111 and 112 stores multiple configuration states (e.g., states A and B in memory 111 and states C and D in memory 112) that can be selected for programming into their respective programming regions. For example, state A or state B in configuration memory 111 can be selected to determine the configuration for the corresponding programming region 122.

Memory 110 also includes context memory 113 and context memory 114, which are used to store state information associated with different configurations. Context memory 113 and context memory 114 store state information for programming regions 122 and 123, respectively.

The memory 115 includes cache 116 and cache 117, which correspond to programming regions 122 and 123, respectively. Each of the caches 116 and 117 is implemented using memory technology (e.g., SRAM or STT-MRAM) that has lower latency than the configuration memory corresponding to the same programming region. For example, the configuration memory 111 may be implemented using DRAM while the cache 116 is implemented using SRAM or Spin-transfer torque magnetic random-access memory (STT-MRAM). The lower latency memory is used to cache configuration bitstream data in order to reduce the time for reconfiguring the hardware in a programming region.

The computing system 100 includes a memory controller 102 coupled with the TSVs 104 that includes logic for facilitating communication between other devices attached to the TSVs 104. For example, the processor 101 may direct the memory controller 102 to facilitate communication between the configuration memory regions 111 and 112 and the FPGA 120 by addressing one of the memory regions 111 or 112, reading configuration data from the addressed memory region into a temporary buffer (e.g., SRAM) over the TSVs, addressing the FPGA 120, and writing the configuration data to the FPGA 120 over the TSVs in order to reconfigure the corresponding programming region 122 or 123. The memory controller 102 thus coordinates data transfer between these components of the computing system 100.

In computing system 100, the memory controller 102 establishes communications with one of the devices connected to the TSVs (e.g., FPGA 120 or memory 110) by selecting the device via a device select signal 102*a*. In alternative embodiments, the device select signal may extend to additional devices other than the FPGA 120 and memory 110. Alternatively, other addressing methods may be used; for example, an address for the selected device may be transmitted over the TSVs 104.

The computing system 100 includes a compiler 103 that generates instructions based on source code. The instructions generated by the compiler 103 are stored in the memory subsystem 110, from which the instructions can be retrieved and executed by the processor 101.

Figure 2:
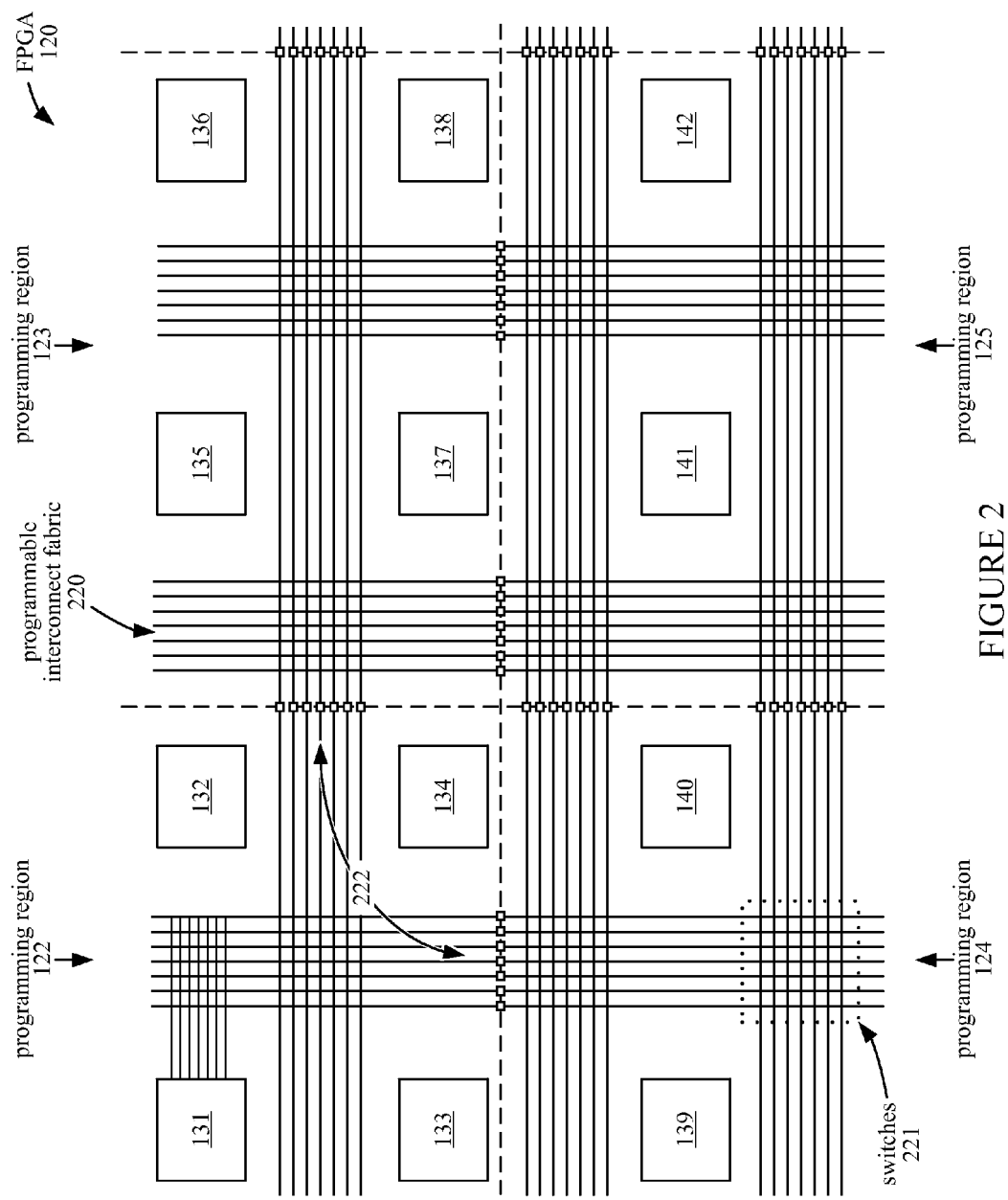
FIG. 2 illustrates components of a field programmable gate array (FPGA), according to an embodiment.

FIG. 2 illustrates internal components of an embodiment of FPGA 120. The FPGA 120 is a programmable device comprising an array of programmable circuit elements called logic blocks (i.e., blocks 131-142) and interconnect resources 220-222 used to selectively connect the logic blocks 131-142.

In the FPGA 120, the boundaries of programming regions 122-125 are indicated by the dashed lines. Programming region 122 includes logic blocks 131-134, programming region 123 includes logic blocks 135-138, programming region 124 includes logic blocks 139 and 140, and programming region 125 includes logic blocks 141 and 142. The programming regions 122-125 divide the programmable logic contained in the FPGA 120 into separate configuration domains, which can be operated and programmed independently of each other, or combined to operate as larger programmable regions.

After programming, the logic contained in the programming regions 122-125 can be used as part of a central processing unit (CPU) or graphics processing unit (GPU) pipeline. Accordingly, a programming region can be used to execute one or more instructions received in an instruction stream provided to the FPGA 120 from a CPU or GPU.

As illustrated in FIG. 2, the programming regions 122 and 123 each include four configurable logic blocks, while the programming regions 124 and 125 each include two configurable logic blocks. Thus, a given programming region need not have the same number of configurable logic blocks as another programming region in the same programmable device. In alternative embodiments, programming regions may include fewer or more than the illustrated number of configurable logic blocks.

Each of the configurable logic blocks 131-142 includes lookup tables (LUTs) and fixed function blocks. After programming, each combination of function inputs to an LUT results in a predefined output, allowing for the implementation of arbitrary logic functions. Each of the configurable logic blocks can be programmed to perform various functions by writing appropriate values into the LUTs and into configuration memory regions or registers that control the connections between the components (e.g., LUTs, fixed function blocks, etc.) in the logic block.

The configurable logic blocks 131-142 are each connected to a programmable interconnect fabric 220, which includes conductive traces and switches that allow the blocks 131-142 to be selectively connected to each other. In FIG. 2, conductive traces are illustrated connecting the configurable logic 131 to the programmable interconnect fabric 220. The other blocks 132-142 are also connected to the interconnect fabric 220 via conductive traces; however, the conductive traces connecting these blocks 132-142 to the interconnect fabric 220 are omitted from the illustration for the sake of clarity.

The programmable interconnect fabric 220 may in alternative embodiments be less uniform than illustrated in FIG. 2. For example, the interconnect fabric may include conductive traces that have different lengths or may have different numbers of parallel conductive traces in different regions of the FPGA 120. The conductive traces of the interconnect fabric 220 are connected to each other by switches where they intersect. For example, region 221 (indicated by the dotted lines) where multiple traces intersect includes a switch between each intersection between two conductive traces. Alternatively, switches may be present at only some of the intersections in region 221.

The programmable interconnect fabric also includes boundary switches, such as switches 222, that can be used to selectively isolate the components in one programming region from the other programming regions. The boundary switches are located at the boundaries of the programming regions 122-125 in the FPGA 120. For example, the boundary switches 222 are located where the conductive traces of the programmable interconnect fabric 220 cross the boundary of the programming region 122.

Accordingly, the boundary switches 222 can be used to disconnect the configurable logic blocks 131-134 and other components of the programming region 122 from the other programming regions 123-125. Additionally, boundary switches can be selectively closed or opened in order to combine programming regions. For example, the boundary switches 222 that are between programming regions 122 and 123 can be closed to combine regions 122 and 123 with each other while the other boundary switches remain open to isolate the combined programming region 122 and 123 from the other programming regions 124 and 125.

With reference to FIG. 1, the FPGA 120 includes configuration logic 121, which facilitates the programming of the programming regions 122 and 123 in FPGA 120. In particular, configuration logic 121 responds to instructions received via the TSVs 104 by reconfiguring the hardware in the configurable logic blocks 131-134 of programming region 122 or configurable logic blocks 135-138 of programming region 123 from an existing hardware configuration to a new hardware configuration. Reconfiguration of the hardware in one programming region by the configuration logic 121 can take place while a different programming region is being used to execute one or more instructions.

The configuration logic 121 responds to explicit reconfiguration instructions received via the TSVs 104 to reconfigure one or more of the programming regions in FPGA 120, and can also respond implicitly to instructions that request the use of a particular function by reconfiguring one or more of the programming regions to perform the particular function.

Explicit reconfiguration instructions that are included in the instruction stream may be received during runtime operation of the FPGA 120, and identify both the programming region targeted for reconfiguration and a selected configuration for the targeted programming region. In response to an explicit reconfiguration instruction, the configuration logic 121 reconfigures the targeted programming region by isolating the targeted programming region (e.g., by opening the boundary switches at the edges of the targeted programming region), then applying the selected configuration to the targeted programming region to reconfigure the targeted programming region independently of any other programming regions in the FPGA 120.

An explicit reconfiguration instruction references a function to be implemented in the targeted programming region by directly referencing the address of an FPGA programming bitstream or by referencing one of a set of predefined customizable functions. For example, states A and B in configuration memory 111 each correspond to a function that can be programmed into programming region 122, while states C and D stored in configuration memory 112 each correspond to a function that can be programmed into programming region 123. Each of the states A, B, C, and D stores a configuration bitstream that can be used to implement its corresponding function in the programming region.

The configuration bitstreams are stored in the configuration memory regions 111 and 112 prior to the configuration logic 121 receiving an explicit reconfiguration instruction that requests implementation of the corresponding function. For example, the configuration bitstreams may be stored upon initiating the execution of the application that produces the instruction stream, or may be stored at the beginning of a program loop or other execution barrier in the application.

The configuration logic 121 is also capable of reconfiguring hardware in one of the programming regions 122 or 123 implicitly even when no explicit reconfiguration instruction is received. For example, if an instruction is received that invokes a function that is not implemented in any of the programming regions 122 and 123, the configuration logic 121 reconfigures one or more of the programming regions 122 and 123 to implement the function prior to executing the instruction in the reconfigured one or more programming regions.

The configuration memory for a particular programming region also records the current configuration for the programming region. For example, the configuration memory 111 associated with programming region 122 stores the current configuration for programming region 122. Thus, when an instruction is received that invokes a particular function, the current configuration for the programming region can be checked to determine whether the instruction can be executed in the programming region or the programming region should be reconfigured in order to execute the instruction. In alternative embodiments, the current configuration of each programming region 122-123 in the FPGA 120 is stored at a location other than the configuration memory regions 111-112; for example, the current configurations may be recorded in memory or registers located on the FPGA 120 itself.

In response to an instruction that invokes a particular function, the current configuration for each of the programming regions 122-123 of the FPGA 120 are checked to determine whether the invoked function can be executed in any of the programming regions 122-123. If none of the programming regions 122-123 are configured to execute the invoked function, the configuration logic 121 reconfigures one or more of the programming regions 122-123 to a new configuration that can execute the invoked function.

Figure 3:
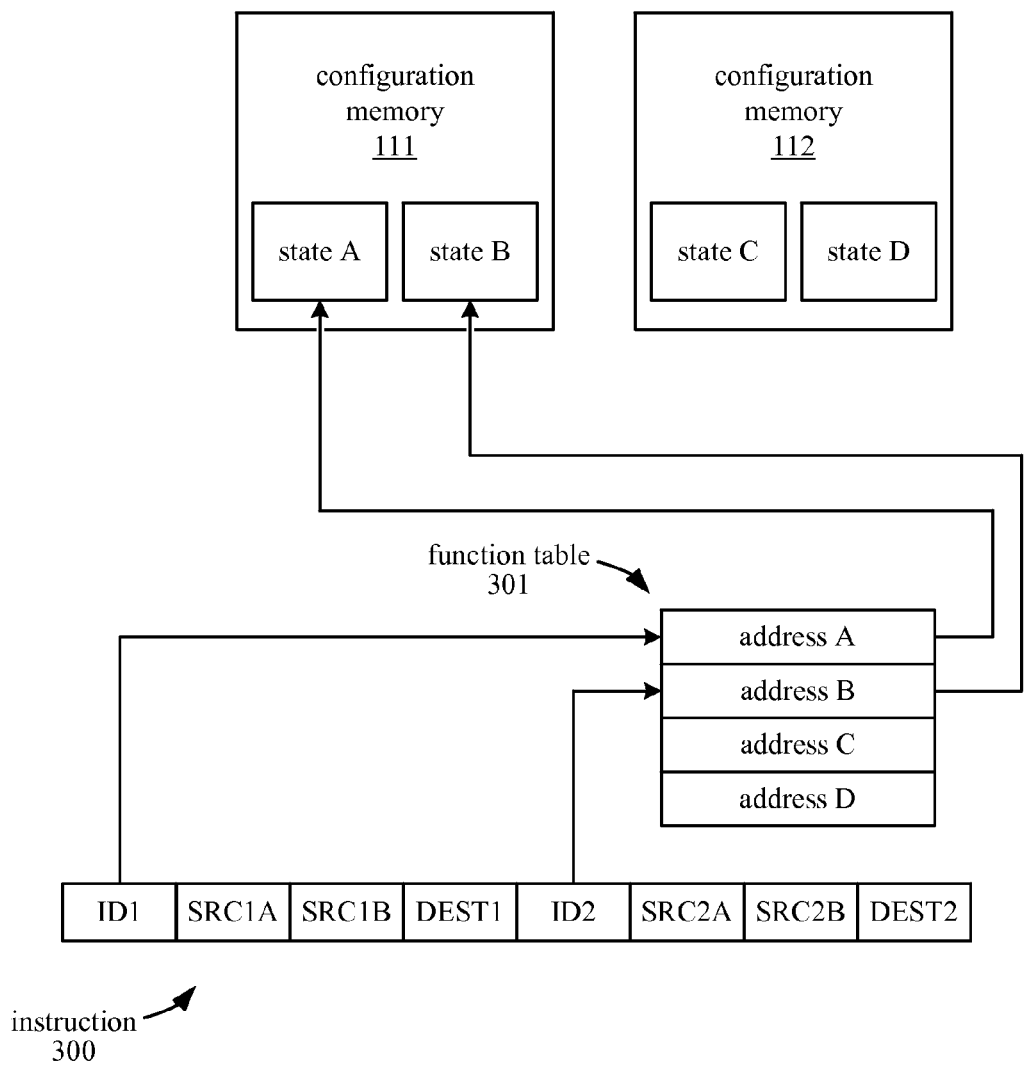
FIG. 3 illustrates the operation of a function table, according to an embodiment.

FIG. 3 is a block diagram, according to an embodiment, that illustrates how a configuration bitstream for a programming region is located in memory based on a received instruction 300 when the configuration logic 121 performs an implicit reconfiguration of the programming region. As illustrated in FIG. 3, the received instruction 300 is a single instruction multiple data (SIMD) instruction that identifies two functions, which are identified by the values ID1 and ID2. For function ID1, the instruction 300 identifies two operands SRC1A and SRC1B and a destination DEST1 for the function result. For function ID2, instruction 300 similarly identifies two operands SRC2A and SRC2B and a destination DEST2 for the function result.

Upon receiving the instruction 300, the configuration logic 121 references the entries for the invoked functions ID1 and ID2 in a function table 301. As illustrated in FIG. 3, the function table 301 returns address A and address B for the functions ID1 and ID2, respectively. Addresses A and B identify the locations of the configuration bitstreams (i.e., state A and state B) that are stored in the configuration memory 111. The configuration logic uses the identified configuration bitstreams stored at state A and state B to reconfigure the programming region 123 for execution of the instruction 300.

The configuration bitstreams at states A-D can define functions for implementing in programming regions 122-123 that are simple single operations or more complex compound operations. When programmed, the programming regions 122-123 can be used as independent logical units that are each accessible through a range of memory addresses. When executing an instruction in an appropriately configured programming region, operands of the instruction can be passed via predefined operand registers that are connected to inputs of the programming region.

The configurable logic blocks 131-138 in the FPGA 120 can contain a significant portion of the architected state of the computer system 100. For example, state information may include values that can be modified during execution of instructions in a programming region. When a context switch is effected by reconfiguration of the logic blocks 131-138, the state of the reconfigured logic blocks can be stored temporarily so that it can be restored at a later time. For example, a first thread being executed in a programming region can be paused so that a second thread can reconfigure the programming region, then the prior configuration and context of the programming region can be restored from a context memory in order to resume the first thread after the second thread is finished executing in the programming region.

Referring back to FIG. 1, configuration memories 111 and 112 include context memories 113 and 114, which are associated with programming regions 122 and 123, respectively. The context memories 113 and 114 are used to store the state information of the logic blocks in their respective programming regions 122 and 123. Prior to a reconfiguration of one of the programming regions 122 or 123, the context memory of the programming region to be reconfigured stores the state information of the logic blocks in the programming region so that the original configuration of the programming region can be restored later with the same context.

Specifically, the context data can include information that identifies the hardware configuration of the programming region and values stored in registers and memory blocks in the programming region. Data stored in the context memory 113 or 114 can be organized as a logical stack; thus, the context data associated with a first configuration of a programming region is pushed onto the stack prior to reconfiguring the programming region to a second configuration. When the programming region is reconfigured back to the first configuration, the context data for the first configuration is popped from the stack to restore the context for the first configuration.

In general, operations described herein as being performed by one of the illustrated components in the computing system 100 can in alternative embodiments be performed by other components in the computing system 100. For example, the operations performed by the configuration logic 121 can in other embodiments be performed in other components of the computing system 100. Configuration memories 111 and 112 are illustrated as being located on a separate memory 110, but can alternatively be located in other components in the computing system 100. For example, the FPGA 120 may in alternative embodiments include memory that can be used to perform the functions of the configuration memories 111 and 112.

With reference to FIG. 1, the compiler 103 in the computing system 100 generates instructions for an application based on source code for the application, and stores the generated instructions in a location that is accessible to processor 101 (e.g., memory 110). In alternative embodiments, the instructions are stored in a memory location that is separate from memory 110, such as a hard disk drive or other persistent memory. The compiler 103 is illustrated in FIG. 1 as executing on the computing system 100; however, in alternative embodiments, the compiler may be run on a separate computing system and the generated instructions transmitted to computing system 100.

When generating instructions for the computing system 100, the compiler 103 inserts instructions that pre-load the configuration memory regions (e.g., memories 111 and 112) with configuration bitstreams for programming the programming regions in the FPGA 120. The compiler identifies the types of instructions that may be executed based on the source code, then inserts the instructions for pre-loading the appropriate configuration bitstreams for implementing the functions for executing the instructions. For example, the compiler 103 generates instructions to pre-load the configuration states A, B, C, and D in the configuration memories 111 and 112 prior to execution of instructions that utilize those configurations of the programming regions 122 and 123. The pre-loading of configuration bitstreams into the configuration memories 111 and 112 allows the configuration logic 121 to quickly perform implicit reconfiguration of programming regions in response to instructions in the instruction stream.

The compiler 103 is also capable of inserting explicit reconfiguration instructions in the instruction stream for an application. Based on the application's source code, the compiler 103 identifies an instruction that is executable by a function that can be implemented in a programming region, then inserts an explicit reconfiguration instruction in the instruction stream prior to the identified instruction. The explicit reconfiguration instruction thus causes one of the programming regions to be reconfigured for execution of the identified instruction before the identified instruction is scheduled to be executed.

The compiler 103 schedules the explicit reconfiguration instruction prior to usage of the programming region being reconfigured and may also schedule the explicit reconfiguration instruction so that the reconfiguration takes place while other instructions are being executed in parallel in other programming regions of the FPGA 120 or in the processor 101. Instructions that are dependent on the completion of the explicit reconfiguration instruction indicate that dependence as part of the instruction, preventing execution of the instruction until reconfiguration is complete.

The compiler 103 is also capable of inserting a configuration prefetch instruction based on identifying an instruction that calls for a particular function to be implemented in a programming region and the reconfiguration latency for implementing the function. The configuration prefetch instruction transfers configuration bits for a programming region from main memory into a faster memory, such as a local SRAM or STT-MRAM buffer, prior to an anticipated explicit or implicit configuration change for the programming region. The configuration prefetch instruction can thus reduce the latency for reconfiguring the programming region.

The compiler 103 also attempts to cluster together groups of instructions that use the same programmable function in order to reduce the number of times the programming regions are reconfigured, thus reducing the amount of time spent and power consumed for reconfiguring the programming regions.

The compiler 103 may also insert a reconfiguration barrier instruction in the instruction stream of the application. A reconfiguration barrier instruction causes multiple threads to wait for a reconfiguration of one or more programming regions to be completed before execution of any of the multiple threads continues. A reconfiguration barrier instruction could be used, for example, to reconfigure one or more programming regions implementing multiple execution lanes to a new set of functions for executing a new workgroup.

Figure 4A:
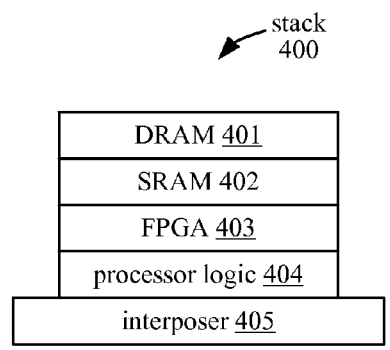
FIG. 4A illustrates a die stack, according to an embodiment.

FIG. 4A illustrates a physical arrangement of the components of computing system 100 as three-dimensional (3D) die stack 400, according to an embodiment. As illustrated in FIG. 4A, multiple integrated circuit dies 401-404 are arranged vertically over an interposer 405 in stack 400. The stack of integrated circuit dies includes a DRAM die 401, SRAM die 402, FPGA die 403, and processor logic die 404 stacked from top to bottom, respectively. The processor logic die 404 corresponds to processor logic block 105 as illustrated in FIG. 1; thus, processor 101 and memory controller 102 of the computing system 101 reside on the processor logic die 404. The FPGA 120 resides on the FPGA die 403. The DRAM die 401 is accessible by the processor 101 and FPGA 120 and includes the memory 110 for storing program code, program data, and configuration bitstreams in configuration memory regions 111 and 112.

The SRAM die 402 includes memory having lower latency than the DRAM 401 and is provided for storing configuration bitstreams in addition to the DRAM 401. The SRAM die 402 is used to implement memory 115, including configuration caches 116 and 117, which perform caching of configuration bitstreams, thus allowing reconfiguration of programming regions in the FPGA 120 in fewer clock cycles. The SRAM die 402 can also be used to cache instructions. In alternative embodiments, an STT-MRAM memory die or other memory technology that is faster than DRAM is used instead of an SRAM die 402.

The arrangement of the components 401-405 in a 3D die stack 400 and the connection of these components 401-405 by one or more sets of TSVs facilitates the rapid transfer of new configurations to the configurable logic blocks 131-138 in the programming regions 122 and 123 of the FPGA 120. As arranged in stack 400, the computing system 100 is capable of reconfiguring a programming region in a few clock cycles in response to an explicit or implicit instruction in a program's instruction stream.

Figure 4B:
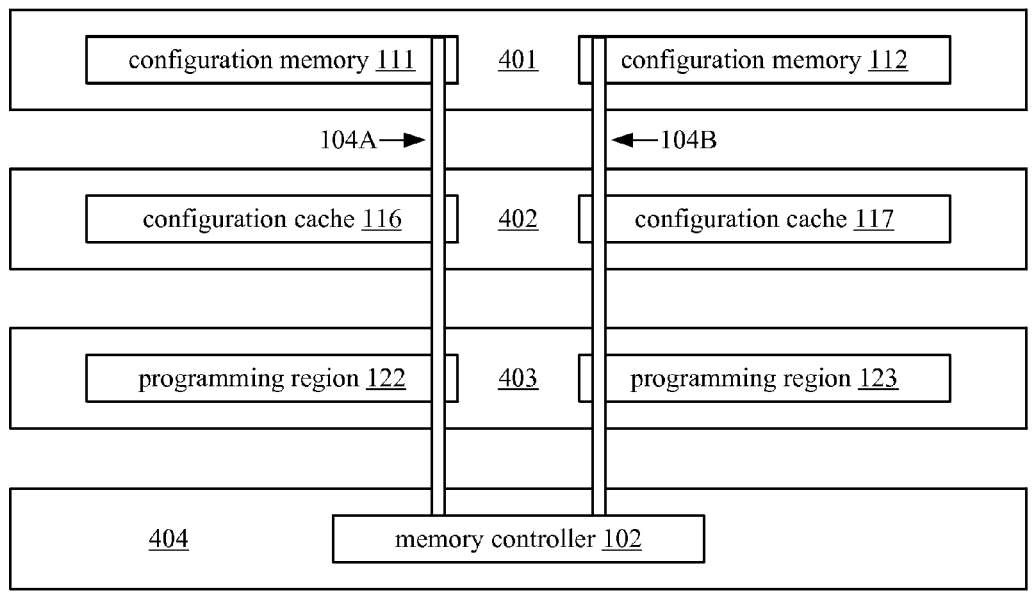
FIG. 4B illustrates through-silicon vias (TSVs) in a die stack, according to an embodiment.

FIG. 4B illustrates the DRAM memory die 401, SRAM memory die 402, FPGA die 403, and processing logic die 404, along with the TSVs 104A and 104B that connect and enable communication between the dies 401-404. TSVs 104, as illustrated in FIG. 1, include TSVs 104A and 104B. TSVs 104A and 104B may each represent one or multiple TSVs between the stacked dies 401-404. For example, each set of TSVs 104A and 104B can include subsets of command, address and data TSVs. TSVs 104A provide a data path for communication between the configuration memory 111, the configuration cache 116, the programming region 122, and the memory controller 102. TSVs 104B provide a direct data path for communication between the configuration memory 112, the configuration cache 117, the programming region 123, and the memory controller 102.

In the die stack 400, configuration caches and configuration memory regions are physically located nearer to their corresponding programming regions than to any other programming region in the FPGA 120. For example, configuration memory 111 and configuration cache 116 are each located nearer to their corresponding programming region 122 than to any other programming region (e.g., programming region 123) in the FPGA 120. Similarly, configuration memory 112 and configuration cache 117 are each located nearer to their corresponding programming region 123 than to any other programming region. Additionally, each configuration memory and configuration cache in stack 400 is stacked so that at least a portion of the memory or cache is located above its corresponding programming region. The positioning of configuration memory and cache regions nearest their associated programming regions and the vertical stacking of memory dies 401 and 402 above the FPGA die 403 minimize the lengths of the TSVs 104A and 104B to facilitate faster transmission of configuration data.

Each programming region in the FPGA 120 has dedicated bus bandwidth between itself and a common memory controller 102 located on the processor logic die 404. In alternative embodiments, memory controller 102 can be located on a different die (e.g., the FPGA die 403) instead of the processing logic die 404. When reconfiguration of a programming region takes place, the memory controller 102 reads the appropriate configuration bitstream data over the TSVs from the configuration memory or configuration cache associated with the programming region being reconfigured. The memory controller 102 then writes the configuration bitstream data to the programming region over the TSVs. In an alternative embodiment, each programming region may have its own simple memory controller implemented in the FPGA 120, rather than a common memory controller 102 that is used to communicate with multiple programming regions.

FIGS. 5A-5D illustrate alternative embodiments of the computing system 100, where the dies on which components of the computing system 100 reside are arranged differently than in stack 400. For stacks 510, 520A-B, 530A-B, and 540A-C, as illustrated in FIGS. 5A, 5B, 5C, and 5D, respectively, the dies included in these die stacks have similar features as their similarly named counterparts in stack 400. In alternative embodiments, other arrangements are possible; for example, some of the components of the computing system 100 may be located on different dies, as compared to 400.

Figure 5A:
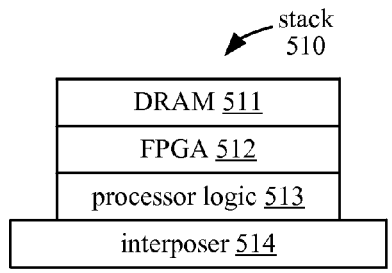
FIG. 5A-5D illustrate die stacks, according to various embodiments.

FIG. 5A illustrates a die stack 510 that includes a DRAM die 511, FPGA die 512, and processor logic die 513 stacked from top to bottom, respectively, above an interposer 514. Compared to stack 400 illustrated in FIG. 4A, stack 510 has reduced cost and complexity due to omission of the low latency memory die (e.g., SRAM die or STT-MRAM die).

Figure 5B:
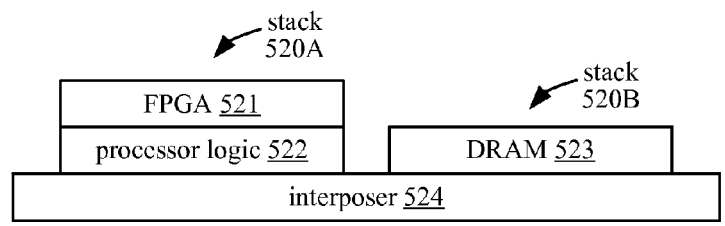

FIG. 5B illustrates an arrangement where the dies on which the components of computing system 100 reside are located in two stacks 520A and 520B. Stack 520A includes the FPGA die 521 and the processor logic die 522 stacked from top to bottom, respectively, above an interposer 524. A DRAM memory die 523 is stacked above the same interposer 524 in an adjacent stack 520B, with the interposer 524 providing electrical connections to enable communication between the dies in the different stacks 520A and 520B. The separation of logic dies 521 and 522 from the memory die 523 facilitates dissipation of heat from the structure.

Figure 5C:
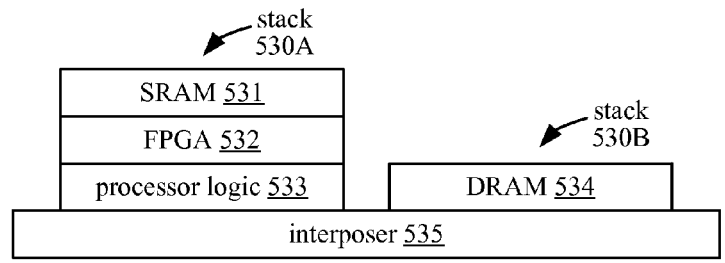

FIG. 5C illustrates a structure including die stacks 530A and 530B having a similar arrangement as die stacks 520A and 520E illustrated in FIG. 5B; however, in contrast with stack 520A, stack 530A includes an additional low latency memory die (i.e., SRAM die 531) stacked above the FPGA die 532 and the processor logic die 533. The SRAM die 531 is used to implement configuration cache memory in order to reduce the time for reconfiguring programming regions in the FPGA 120. DRAM die 534 is located in an adjacent stack 530B, and both die stacks 530A and 530E are stacked above an interposer 535 that provides electrical connections to enable communication between the dies in the different stacks 530A and 530B.

Figure 5D:
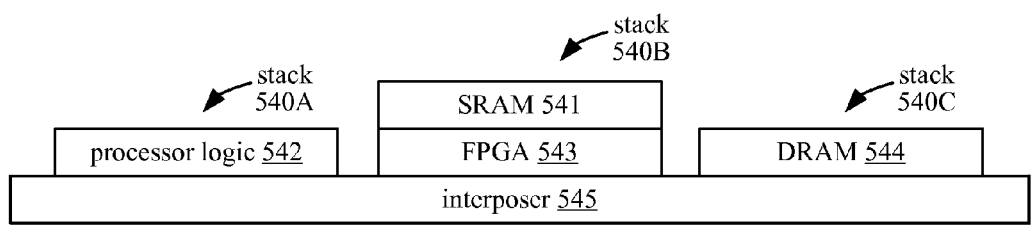

FIG. 5D illustrates a structure where the components of computing system 100 are arranged in three die stacks 540A, 540B, and 540C above a common interposer 545. The arrangement of dies into the multiple die stacks 540A, 540B, and 540C facilitates dissipation of heat from the structure. Die stack 540A includes the processor logic die 542, die stack 540C includes the DRAM die 544, and die stack 540E includes the SRAM die 541 stacked above the FPGA die 543. The dies 541-544 are each capable of communicating with dies in other stacks through electrical connections provided by the common interposer 545.

Figure 6:
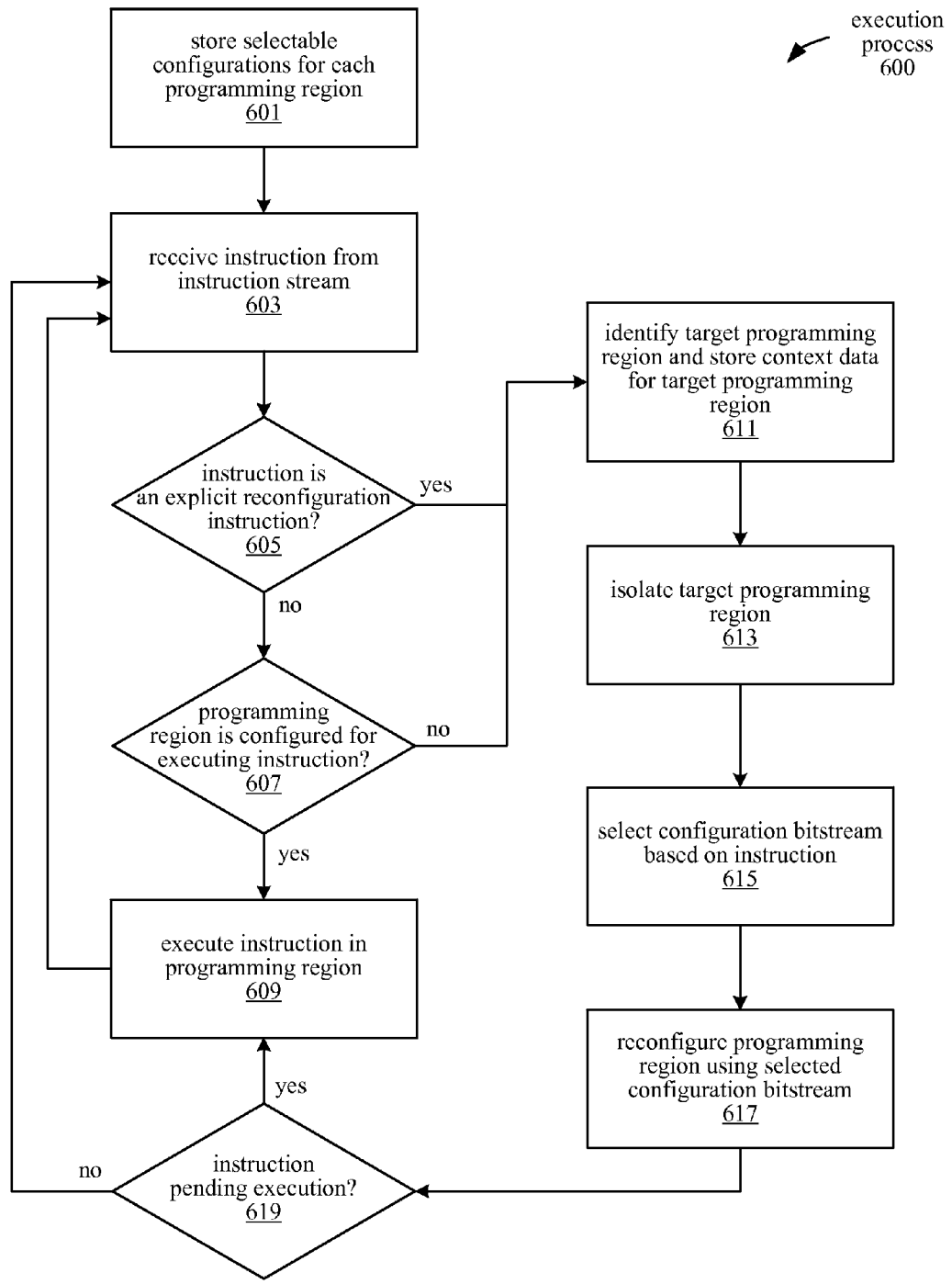
FIG. 6 is a flow diagram illustrating a process of executing instructions in a computing system, according to an embodiment.

FIG. 6 illustrates an embodiment of a process 600 for executing an instruction stream in a computing system 100 that includes an FPGA 120 that is reconfigurable based on instructions in the instruction stream. The operations of process 600 are performed by various components of the computing system 100 in order to execute the instructions in an instruction stream issued from the processor 101. In one embodiment, the instruction stream is a continuous instruction stream that includes at least a subset of the instructions for defining a single computer program.

The process 600 begins at block 601. At block 601, the computing system 100 stores one or more selectable configurations for each programming region in the FPGA 120. For example, the configuration memory 111 associated with programming region 122 stores at least two configurations, state A and state B, that can be selected for programming into programming region 122. Continuing this example, state A may include a configuration bitstream for configuring the programming region 122 to implement four adder units, while state B includes a configuration bitstream for configuring the programming region 122 to implement four multiplier units. From block 601, the process 600 continues at block 603.

At block 603, the FPGA 120 receives a first instruction in the instruction stream. For example, the processor 101 may dispatch the instruction to be executed in one of the programming regions of the FPGA 120. The instruction is received at the configuration logic 121 of the FPGA 120. From block 603, the process 600 continues at block 605.

At blocks 605-607, the configuration logic 121 determines based on the received instruction whether any of the programming regions should be reconfigured before the received instruction or a subsequent instruction can be executed. At block 605, the configuration logic 121 determines whether the instruction received at block 603 is an explicit reconfiguration instruction. If the instruction is not an explicit reconfiguration instruction, the process 600 continues at block 607.

At block 607, the configuration logic 121 determines whether any programming region is already configured for executing the instruction received at block 603. For example, if the instruction is a multiplication instruction, the configuration logic 121 determines whether the existing configuration of either of the programming regions 122 or 123 includes a multiplier unit that can be used to execute the instruction. At block 607, if at least one of the programming regions is capable of executing the instruction, then the process 600 continues at block 609.

At block 609, the instruction is executed in the programming region that is appropriately configured for executing the instruction. Thus, by the operation of blocks 603-609, an instruction that is not an explicit reconfiguration instruction and that is received when a programming region is appropriately configured for executing the instruction is simply executed in the programming region in response to receiving the instruction. From block 609, the process 600 continues back to block 603.

At block 603, the FPGA 120 receives a second instruction in the instruction stream, which causes one or more programming regions to be reconfigured. The second instruction can be the next following instruction after the first instruction in the instruction stream. In other words, an instruction that causes reconfiguration of a programming region can be part of the same continuous instruction stream as the first instruction that is executed in a programming region using an existing configuration. In one embodiment, an instruction stream can be considered continuous while a process or entity controlling the instruction stream is allowed to proceed automatically from each instruction in the stream to the next instruction without interruption by another process or entity (e.g., the operating system, hardware device, etc.). From block 603, the process 600 continues at block 605.

At block 605, the configuration logic 121 determines whether the second instruction received at block 603 is an explicit reconfiguration instruction. An explicit reconfiguration instruction identifies a programming region and a configuration for the identified programming region. For example, an explicit reconfiguration instruction may identify programming region 122 and state B in configuration memory 111 for configuring programming region 122. If the second instruction is an explicit reconfiguration instruction, the process 600 continues at block 611. Otherwise, the process 600 continues at block 607.

At block 607, the configuration logic 121 determines whether any programming region is already configured for executing the second instruction received at block 603. If a programming region in FPGA 120 is already configured for execution of the second instruction, then the process 600 continues at block 609 and the instruction is executed in the programming region; otherwise, the process 600 continues at block 611.

At block 611, the configuration logic 121 identifies one or more target programming regions in the FPGA 120 and prepares to reconfigure the one or more target programming regions by storing context data for the one or more target programming regions in the context memory corresponding to the one or more target programming regions. For example, when the reconfiguration is being performed in response to an explicit reconfiguration instruction, the explicit reconfiguration instruction indicates which of the programming regions in the FPGA 120 are to be reconfigured. For implicit reconfigurations, the configuration logic 121 may identify as a target programming region a programming region that is not being used or not expected to be used in the near future. From block 611, the process 600 continues at block 613.

At block 613, the configuration logic 121 isolates the target programming region from other programming regions in the FPGA 120 by opening the boundary switches at the border of the target programming region to disconnect the configurable logic blocks of the target programming region from the other programming regions. This isolation of the target programming region from allows the hardware in the target programming region to be reconfigured independently from any of the other programming regions in the FPGA 120. With reference to FIG. 2 and continuing the previous example with programming region 122 as the target programming region, the configuration logic 121 isolates the configurable logic blocks 131-134 of the programming region 122 by disconnecting the boundary switches 222 at the border of the programming region 122. From block 613, the process 600 continues at block 615.

At block 615, the configuration logic 121 selects one of the configurations for the target programming region based on the instruction received at block 603. When the instruction is an explicit reconfiguration instruction, the configuration logic 121 selects the configuration indicated in the instruction. For example, an explicit reconfiguration instruction indicating a 'state B' configuration would cause the configuration logic 121 to select the configuration bitstream corresponding to state B that is stored in the configuration memory 111.

Alternatively, if the instruction received at block 603 is not an explicit reconfiguration instruction, the configuration logic 121 selects a configuration using the function table 301, as illustrated in FIG. 3. The configuration logic 121 looks up the opcodes (e.g., ID1, ID2) of the instruction in the function table 301 to determine the addresses (e.g., address A, address B) of the configuration bitstreams for configuring the programming region. From block 615, the process 600 continues at block 617.

At block 617, the configuration logic 121 reconfigures the hardware in the configurable logic blocks of the target programming region using the selected configuration bitstream. The memory controller 102 retrieves the selected configuration bitstream from the configuration memory and transmits the bitstream to the FPGA 120 over the TSVs 104. The configuration logic 121 then reconfigures the target programming region using the configuration bitstream. For example, for a target programming region 122 to be reconfigured according to state B, the configuration logic 121 receives the configuration bitstream corresponding to state B over the TSVs 104 and programs the configurable logic blocks 131-134 of programming regions 122 using the configuration bitstream for state B. In one embodiment, the configuration bitstream may be cached in a corresponding cache memory 141 of the target programming region 122. In one embodiment, a time duration for reconfiguring the hardware in one or more configurable logic blocks of a target programming region can be less than 1 millisecond. From block 617, the process 600 continues at block 619.

At block 619, if the instruction received at block 603 is pending execution, then the process 600 continues at block 609 and the instruction is executed in the reconfigured programming region. Otherwise, if the instruction is not pending execution (e.g., when the instruction is an explicit reconfiguration instruction for which the reconfiguration is completed), then the process 600 continues back to block 603 to receive the next instruction in the instruction stream. The execution process 600 thus operates in a loop to execute instructions received in the instruction stream, appropriately reconfiguring programming regions when explicitly instructed or implicitly in response to demand for a particular function.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware comprising the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader spirit and scope of the embodiments as set forth in the appended claims. The specification and drawings are, accordingly, to be regarded in an illustrative sense rather than a restrictive sense.

What is claimed is:

1. A programmable device, comprising:
   one or more programming regions, each comprising a plurality of configurable logic blocks, wherein each configurable logic block of the plurality of configurable logic blocks is selectively connectable to any other configurable logic block of the plurality of configurable logic blocks via a programmable interconnect fabric, wherein a first programming region of the one or more programming regions is configured to execute a first instruction in an instruction stream; and
   configuration logic configured to, in response to a second instruction in the instruction stream, reconfigure hardware in one or more of the plurality of configurable logic blocks in the first programming region independently from any other programming region of the one or more programming regions, wherein the first programming region is configured to execute the second instruction using the reconfigured hardware in the one or more of the plurality of configurable logic blocks in the first programming region.

2. The programmable device of claim 1, wherein each programming region is coupled with a configuration memory configured to store a plurality of selectable configurations for the programming region, and the configuration logic is further configured to reconfigure the programming region based on a selected configuration of the plurality of selectable configurations stored in the configuration memory of the programming region.

3. The programmable device of claim 2, wherein the configuration memory comprises static random access memory (SRAM).

4. The programmable device of claim 2, wherein the configuration memory is located nearer to the programming region than to any other programming region.

5. The programmable device of claim 1, wherein the instruction stream is a continuous instruction stream including at least a subset of the instructions defining a single computer program, and wherein the second instruction is a next following instruction after the first instruction in the instruction stream.

6. The programmable device of claim 1, further comprising a set of boundary switches in the programmable interconnect fabric configured to electrically isolate one programming region from other programming regions.

7. The programmable device of claim 1, wherein the second instruction is a reconfiguration instruction that identifies the first programming region and identifies a selected configuration for the first programming region.

8. The programmable device of claim 1, further comprising a context memory configured to store context data for the first programming region prior to the reconfiguration of the hardware in the one or more configurable logic blocks.

9. The programmable device of claim 1, wherein the programmable device is a field-programmable gate array (FPGA) device.

10. The programmable device of claim 1, wherein the programmable device resides on one of a plurality of stacked dies coupled by through-silicon vias (TSVs).

11. The programmable device of claim 1, further comprising a function table configured to store an address of a configuration bitstream for each of a plurality of instructions, wherein the configuration logic is further configured to identify from the function table an address of a configuration bitstream corresponding to the second instruction.

12. A method, comprising:
in response to receiving a first instruction in an instruction stream, executing the first instruction in a first programming region of one or more programming regions in a programmable device;
in response to receiving a second instruction in the instruction stream, reconfiguring hardware in one or more of a plurality of configurable logic blocks in the first programming region independently from any other programming region of the one or more programming regions; and
executing the second instruction using the reconfigured hardware in the one or more of the plurality of configurable logic blocks in the first programming region.

13. The method of claim 12, further comprising, for each programming region of the one or more programming regions:
storing a plurality of selectable configurations for the programming region; and
reconfiguring the programming region based on a selected configuration of the plurality of selectable configurations stored in the configuration memory of the programming region.

14. The method of claim 13, wherein the second instruction is a reconfiguration instruction that identifies the first programming region and identifies the selected configuration for the first programming region, and wherein reconfiguring the first programming region comprises selecting one of the plurality of selectable configurations stored in the configuration memory of the first programming region based on the second instruction.

15. The method of claim 12, wherein the instruction stream is a continuous instruction stream including at least a subset of instructions defining a single computer program, and wherein the second instruction is a next following instruction after the first instruction in the instruction stream.

16. The method of claim 12, further comprising, isolating the first programming region from other programming regions of the one or more programming regions via a set of boundary switches in a programmable interconnect fabric that connects the plurality of configurable logic blocks.

17. The method of claim 12, further comprising storing context data for the first programming region in a context memory prior to reconfiguring the hardware in the one or more configurable logic blocks.

18. The method of claim 12, wherein the programmable device is a field-programmable gate array (FPGA) device.

19. The method of claim 12, wherein the programmable device resides on one of a plurality of stacked dies coupled by through-silicon vias (TSVs).

20. The method of claim 12, further comprising:
storing in a function table an address of a configuration bitstream for each of a plurality of instructions; and
identifying from the function table an address of a configuration bitstream corresponding to the second instruction.

21. A computing system, comprising:
a processor configured to dispatch a plurality of instructions in an instruction stream; and
a programmable device coupled with the processor, the programmable device comprising:
one or more programming regions, each comprising a plurality of configurable logic blocks, wherein each configurable logic block is selectively connectable to any other configurable logic block via a programmable interconnect fabric, wherein a first programming region of the one or more programming regions is configured to execute a first instruction in an instruction stream; and
configuration logic configured to, in response to a second instruction in the instruction stream, reconfigure hardware in one or more of the plurality of configurable logic blocks in the first programming region independently from any other programming region, wherein the first programming region is configured to execute the second instruction using the reconfigured hardware in the one or more of the plurality of configurable logic blocks in the first programming region.

22. The computing system of claim 21, further comprising, for each programming region, a configuration memory configured to store a plurality of selectable configurations for the programming region, wherein the configuration memory is located in a dynamic random access memory (DRAM) module stacked above the programmable device, and wherein the configuration memory is coupled to the programming region by one or more through-silicon vias.

23. The computing system of claim 22, further comprising a memory controller coupled with the configuration memory and configured to receive a selected configuration of the plurality of selectable configurations from the configuration memory and apply the selected configuration to the programmable device.

24. The computing system of claim 21, wherein the programmable device comprises a field programmable gate array (FPGA) device.

25. The computing system of claim 21, wherein a first integrated circuit die including the programmable device is stacked above a second integrated circuit die including the processor, and wherein the first integrated circuit die and the second integrated circuit die are coupled by through-silicon vias (TSVs).

26. The computing system of claim 21, further comprising a function table configured to store an address of a configuration bitstream for each of a plurality of instructions, wherein the configuration logic is further configured to identify from the function table an address of a configuration bitstream corresponding to the second instruction.

27. The computing system of claim 21, wherein the configuration logic is configured to reconfigure the hardware in the one or more of the plurality of configurable blocks by reconfiguring the hardware from a first hardware configuration to a second hardware configuration; and wherein the computing system further comprises a compiler configured to:

based on input source code, identify a third instruction executable in the first programming region when the hardware is in the second hardware configuration; and in response to identifying the third instruction, generating the second instruction prior to the third instruction in the instruction stream.

* * * * *